(12) United States Patent
Arakawa et al.

(10) Patent No.: US 8,368,474 B2
(45) Date of Patent: Feb. 5, 2013

(54) SURFACE ACOUSTIC WAVE OSCILLATOR

(75) Inventors: Kazuki Arakawa, Nisshin (JP);
Kazuhiko Kano, Toyoake (JP)

(73) Assignee: Denso Corporation, Kariya (JP)

( * ) Notice: Subject to any disclaimer, the term of this patent is extended or adjusted under 35 U.S.C. 154(b) by 5 days.

(21) Appl. No.: 13/110,990

(22) Filed: May 19, 2011

(65) Prior Publication Data

US 2011/0285470 A1    Nov. 24, 2011

(30) Foreign Application Priority Data

May 21, 2010   (JP) .................................. 2010-117716

(51) Int. Cl.
*H03B 9/12* (2006.01)
(52) U.S. Cl. ........ 331/107 A; 331/56; 331/155; 310/315
(58) Field of Classification Search .............. 331/107 A, 331/56
See application file for complete search history.

(56) References Cited

U.S. PATENT DOCUMENTS

| | | | | |
|---|---|---|---|---|
| 5,016,260 | A | * | 5/1991 | Masuda .......................... 375/307 |
| 7,215,214 | B1 | * | 5/2007 | Taheri et al. .............. 331/107 A |
| 7,230,501 | B2 | | 6/2007 | Ogiso |
| 7,733,190 | B2 | * | 6/2010 | Yajima et al. ............. 331/107 A |
| 2005/0077974 | A1 | * | 4/2005 | Sugiura ....................... 331/107 A |
| 2005/0275487 | A1 | | 12/2005 | Oshio |
| 2009/0160567 | A1 | * | 6/2009 | Martin et al. ............. 331/107 A |

FOREIGN PATENT DOCUMENTS

| | | |
|---|---|---|
| JP | A-61-92011 | 5/1986 |
| JP | A-61-234324 | 10/1986 |
| JP | A-62-081104 | 4/1987 |
| JP | A-62-274081 | 11/1987 |
| JP | A-2-172312 | 7/1990 |
| JP | A-06-224678 | 8/1994 |
| JP | A-09-80035 | 3/1997 |
| JP | A-9-294039 | 11/1997 |
| JP | A-2000-114923 | 4/2000 |
| JP | A-2004-007093 | 1/2004 |
| JP | A-2005-65042 | 3/2005 |
| JP | A-2005-348070 | 12/2005 |
| JP | A-2006-101184 | 4/2006 |
| JP | A-2006-279798 | 10/2006 |
| JP | A-2007-228328 | 9/2007 |
| JP | A-2008-4977 | 1/2008 |

OTHER PUBLICATIONS

Office Action mailed Feb. 14, 2012 in corresponding JP Application No. 2010-117716 (and English translation).

* cited by examiner

*Primary Examiner* — Joseph Chang
(74) *Attorney, Agent, or Firm* — Posz Law Group, PLC (57) ABSTRACT

In a SAW oscillator, each of a first SAW element and a second SAW element includes interdigital electrodes and a reflector formed on a piezoelectric material. A first oscillating circuit part forms an oscillating loop including the first SAW element. A second oscillating circuit part forms an oscillating loop including the second SAW element. The first and second oscillating circuit parts have an identical admittance property. The first and second SAW elements are configured that an electrode pitch is identical and an admittance property indicating a relation between a frequency and an admittance value is different therebetween. Further, a first intersection point between the admittance property of the first SAW element and the admittance property of the first oscillating circuit part and a second intersection point between the admittance property of the second SAW element and the admittance property of the second oscillating circuit part are at different frequencies.

5 Claims, 5 Drawing Sheets

| | IDT PAIR No. | L1, L2 | REFLECTOR | Q-VALUE | RES. FREQ. | OSC. FREQ. |
|---|---|---|---|---|---|---|
| 1st SAW RES. | 10 PAIRS | 20λ | 70 | 1567 | 203.80MHz | 204.47MHz |
| 2nd SAW RES. | 10 PAIRS | 40λ | 70 | 1567 | 203.80MHz | 204.67MHz |

| | IDT PAIR No. | L1, L2 | REFLECTOR | Q-VALUE | RES. FREQ. | OSC. FREQ. |
|---|---|---|---|---|---|---|
| 1st SAW RES. | 10 PAIRS | 20λ | 70 | 1567 | 203.80MHz | 204.47MHz |
| 2nd SAW RES. | 8 PAIRS | 20λ | 70 | 1457 | 203.98MHz | 204.44MHz |

SURFACE ACOUSTIC WAVE OSCILLATOR

CROSS REFERENCE TO RELATED APPLICATION

This application is based on Japanese Patent Application No. 2010-117716 filed on May 21, 2010, the disclosure of which is incorporated herein by reference.

FIELD OF THE INVENTION

The present invention relates to a surface acoustic wave oscillator (SAW oscillator) having a surface acoustic element (SAW element).

BACKGROUND OF THE INVENTION

A frequency-change detection type sensor utilizing the SAW oscillator has been known, for example, in Japanese Patent Application Publications No. 61-234324 (hereinafter, document 1) and No. 9-80035 (hereinafter, document 2). The frequency-change detection type sensor detects a change in oscillating frequency, which is determined by the SAW element and an oscillating circuit forming an oscillation loop.

In the frequency-change detection type sensor, because a resonance frequency of a SAW element is high, such as hundreds of megahertz, an expensive AD converter needs to be used to process high-frequency signals. Otherwise, the oscillating frequency is usually down-converted, for example, to tens of kilohertz, so that the signals can be processed by an inexpensive AD converter. The down-converting is carried out by obtaining a difference of oscillating frequencies of oscillators that employ SAW elements having different resonance frequencies. The difference of the oscillating frequencies is hereinafter referred to as the difference frequency.

In general, the SAW element has interdigital electrodes and reflectors formed on the surface of a piezoelectric material. To form the interdigital electrodes and the reflectors, for example, a thin metal film, such as a thin aluminum film, is formed on the piezoelectric material by sputtering or the like, and then the thin metal film is formed into desired electrode pattern by a photo-etching technique, such as by photo-lithography and etching. Further, because there is a constant relation between the interval (electrode pitch) of the interdigital electrodes and electrodes of the reflectors and a resonance frequency, the electrode pitch is usually adjusted so that the SAW elements have desired resonance frequencies.

For example, Japanese Patent Application Publication No. 6-224678 (hereinafter, document 3) describes a method of adjusting the resonance frequency of the SAW element to a desired resonance frequency. Specifically, after an electrode pattern is formed, a substrate is dry-etched using the electrode as a mask to increase the thickness of the electrode while monitoring the resonance frequency.

Japanese Patent Application Publication No. 2005-65042 describes another method of adjusting the resonance frequency of the SAW element. Specifically, after the electrode pattern is formed, side surfaces of the interdigital electrode are anode-oxidized to increase a mass of the interdigital electrode and to expand a line width of the interdigital electrode.

In order to improve a resolution capability of the frequency-change detection type sensor, jitter needs to be reduced. Therefore, it is necessary to reduce the difference frequency between the two oscillators to a minute level smaller than 500 kilohertz, such as to tens of kilohertz.

In a case where the two oscillators are constructed using the SAW elements having different resonance frequencies, it is necessary to design resonance frequencies of the SAW elements at a minute unit in order to generate such a minute difference frequency. However, it is actually difficult to control the electrode pitch less than 0.1 micrometers by a present photo-lithography technique. For example, with regard to a SAW element having the resonance frequency of 200 megahertz and using a $LiNbO_3$ substrate, the resonance frequency can only be designed by a unit of approximately 1 megahertz. Therefore, it is difficult to design a structure of the SAW element so as to achieve the minute different frequency.

In the documents 3 and 4, the resonance frequency of the SAW element is adjusted after the SAW element is formed once. That is, the resonance frequency is not adjusted in a stage of designing the SAW element. If the adjustment of the resonance frequency is carried out after the SAW element is formed as described in the documents 3 and 4, an adjustment process becomes complex.

Accordingly, there has been no method for designing the SAW elements so that the minute difference frequency can be generated between the two oscillators.

In addition, in the conventional frequency-change detection type sensor utilizing the SAW elements having different resonance frequencies, a detection error may occur.

Figure 14:
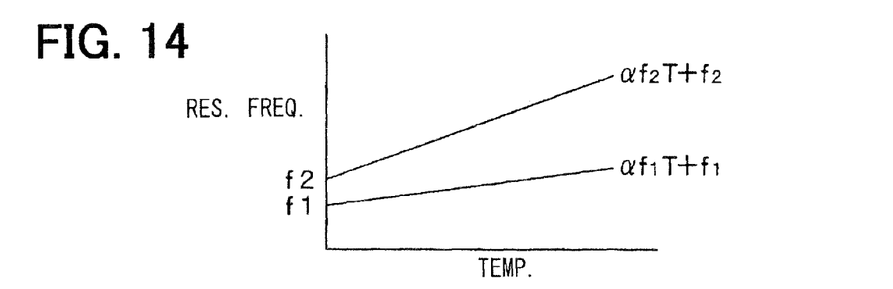
FIG. 14 is a graph showing a temperature property of two SAW elements having different resonance frequencies.

FIG. 14 shows a temperature property of two SAW elements having different resonance frequencies. In general, the SAW element has the temperature property relative to the resonance frequency as defined by an expression below. Therefore, the resonance frequency changes with the temperature (T).

$$f=f_0(1+\alpha T)$$

Further, the temperature characteristic depends on the resonance frequency of the SAW element. Therefore, the two SAW elements having the different resonance frequencies have different temperature properties. Having the different temperature properties means that the amount of change in resonance frequency relative to a change in temperature is different. As such, as shown in FIG. 14, the difference between the resonance frequencies of the two SAW elements ($\Delta f=f2-f1$) varies depending on the temperature ($\Delta f'=(f2-f1)(1+\alpha T)$). Accordingly, as the temperature increases, the difference between the resonance frequencies increases.

As a result, even if an input signal has no change in frequency, the resonance frequencies of the two SAW elements are changed by the change in the temperature, and thus the detection error occurs.

SUMMARY OF THE INVENTION

To reduce the detection error caused by the change in temperature, it is necessary to adjust the resonance frequencies of the two SAW elements to be approximately same values. The present invention is made in view of the foregoing matter, and it is an object of the present invention to provide a SAW oscillator in which the desired minute different frequency is realized in the stage of designing thereof and two SAW elements have substantially the same resonance frequencies.

In a SAW oscillator according to an aspect, a first SAW element and a second SAW element are formed on a piezoelectric material. Each of the first SAW element and the second SAW element includes interdigital electrodes having finger portions and a reflector having reflector-electrodes. A first oscillating circuit part forms an oscillating loop including the first SAW element as a component, and a second oscillating circuit part forms an oscillating loop including the second SAW element as a component. The first oscillating circuit part and the second oscillating circuit part are configured to have an identical admittance property. The first SAW element and the second SAW element are configured such that an electrode pitch of the finger portions and reflector-electrodes is identical between the first SAW element and the second SAW element, and an amplitude of a curve of an admittance property, which indicates a relation between a frequency and an admittance value, is different between the first SAW element and the second SAW element. Further, a first intersection point between the admittance property of the first SAW element and the admittance property of the first oscillating circuit part and a second intersection point between the admittance property of the second SAW element and the admittance property of the second oscillating circuit part are at different frequencies.

An oscillating frequency of an oscillating circuit depends on a combination of a SAW element and the oscillating circuit. In a graph having a frequency and an admittance value as coordinate axes, the oscillating frequency is determined by an intersection point of a curve of an admittance property of the SAW element and an admittance property of the oscillating circuit.

The intersection point can be shifted by changing the amplitude of the curve of the admittance property of the SAW element. The oscillating frequency of the oscillating circuit can be changed by shifting the intersection point. Since the change in the oscillating frequency of the oscillating circuit relative to the change in the amplitude of the admittance property is minute, it is possible to finely adjust the oscillating frequency.

According to the above configuration, by adjusting the amplitude of the admittance property of each the first SAW element and the second SAW element, the difference frequency, which is a difference between the oscillating frequencies of the first oscillating circuit part and the second oscillating circuit part, can be adjusted to a minute frequency in a range between 1 and 500 kilohertz. That is, the SAW oscillator can be configured to have a desired minute difference frequency in a designing stage.

In the above configuration, the electrode pitch of the finger portions and reflector-electrodes is the same between the first SAW element and the second SAW element. Therefore, the first SAW element and the second SAW element have substantially the same resonance frequency. As a result, the first SAW element and the second SAW element have substantially the same temperature property relative to the resonance frequency. Therefore, in a case where the SAW oscillator is employed as a frequency-change detection type sensor, a detection error due to a change in temperature can be reduced. Here, the phrase "substantially the same" means "similar" and "exactly the same".

BRIEF DESCRIPTION OF THE DRAWINGS

Other objects, features and advantages of the present invention will become more apparent from the following detailed description made with reference to the accompanying drawings, in which like parts are designated by like reference numbers and in which.

DETAILED DESCRIPTION OF EXEMPLARY EMBODIMENTS

Exemplary embodiments will be described hereinafter with reference to the drawings. Like parts are designated by like reference numbers throughout the embodiments, and a description thereof will not be repeated.

(First Embodiment)

Figure 1:
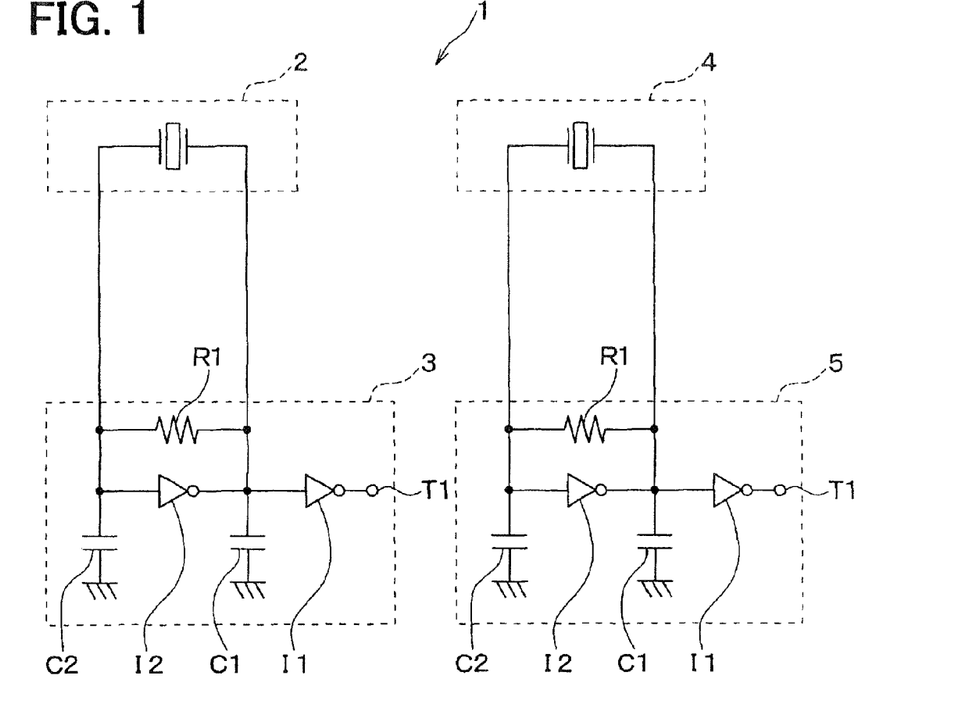
FIG. 1 is a schematic circuit diagram of a SAW oscillator according to a first embodiment of the present invention.
Figure 2:
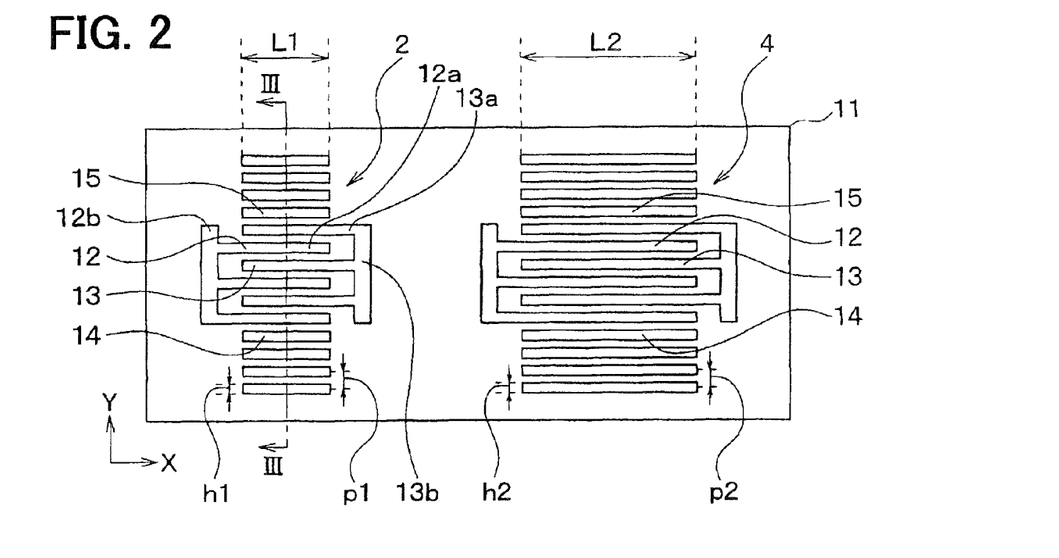
FIG. 2 is a plan view of a first SAW element and a second SAW element of the SAW oscillator shown in FIG. 1.
Figure 3:
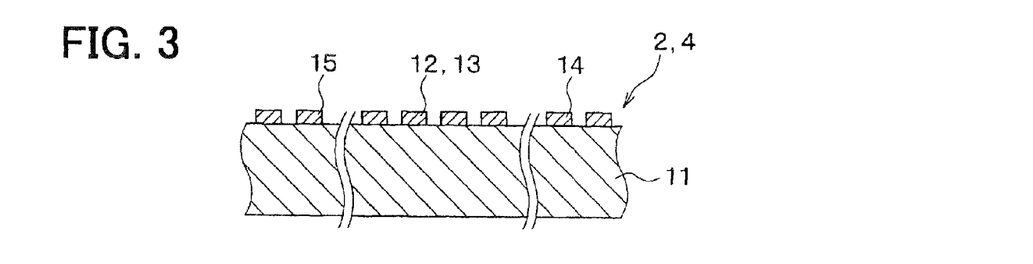
FIG. 3 is a cross-sectional view taken along a line III-III in FIG. 2.

FIG. 1 is a schematic circuit diagram of a SAW oscillator 1 according to a first embodiment. FIG. 2 is a plan view of a first SAW resonator 2 and a second SAW resonator 4 of the SAW oscillator 1. FIG. 3 is a cross-sectional view taken along a line III-III in FIG. 2. The second SAW element 4 has a similar cross-section to that of the first SAW element 2, as shown in FIG. 3.

The SAW oscillator 1 is, for example, used as a frequency-change detection type sensor. As shown in FIG. 1, the SAW oscillator 1 includes a first oscillating circuit 3 and a second oscillating circuit 5. The first oscillating circuit 3 includes the first SAW resonator 2 as a first surface acoustic wave element, and the second oscillating circuit 5 includes the second SAW resonator 4 as a second surface acoustic wave element. Thus, two oscillators are provided by the first oscillating circuit 3 and the second oscillating circuit 5, for example.

The first oscillating circuit 3 and the second oscillating circuit 5 have substantially the same structure, and a general circuit structure is adaptable. Each of the first oscillating circuit 3 and the second oscillating circuit 5 includes inverters I1, I2, a resistor R1 and capacitors C1 and C2 as passive component parts, and an output port T1. The first oscillating circuit 3 forms a positive feedback loop having the first SAW resonator 2 as a component. Likewise, the second oscillating circuit 5 forms a positive feedback loop having the second SAW resonator 4 as a component. In the positive feedback loop, of electric signals inputted to the inverters I1, I2, only a signal that satisfies a condition where a phase is 360°×n and a gain is equal to or greater than 1 is amplified, and only this signal is outputted from the output port T1.

In a case where the SAW oscillator 1 is used as the frequency-change detection type sensor, one of the first SAW resonator 2 and the second SAW resonator 4 is used as a reference device, and the other is used as a detecting device. When an oscillating frequency of the oscillating circuit having the SAW element as the detecting device changes, the difference frequency of output signals from the first oscillating circuit 3 and the second oscillating circuit 5 changes. Thus, by detecting a change in the difference frequency, a change in frequency generated in the SAW element as the detecting device can be detected.

As shown in FIGS. 2 and 3, each of the first SAW resonator 2 and the second SAW resonator 4 includes a piezoelectric substrate 11, interdigital electrodes (IDT) 12, 13 and reflectors 14, 15. The piezoelectric substrate 11 is made of a single-crystal piezoelectric material. The interdigital electrodes 12, 13 and the reflectors 14, 15 are formed on the piezoelectric substrate 11. As the piezoelectric material, for example, lithium niobate, lithium tantalate or the like can be employed.

The interdigital electrodes 12, 13 cause the piezoelectric substrate 11 to excite a surface acoustic wave. Each of the interdigital electrodes 12, 13 has a comb-like shape. Each of the interdigital electrodes 12, 13 includes multiple finger portions 12a, 13a and a bus-bar portion 12b, 13b. The finger portions 12a, 13a are parallel to each other and extend in an X-axis direction. The bus-bar portion 12b, 13b connects the finger portions 12a, 13a. The interdigital electrode 12 and the interdigital electrode 13 have the same number of finger portions 12a, 13a. The interdigital electrodes 12, 13 are arranged in an interdigitated manner. The finger portions 12a and the finger portions 13a are alternately arranged. By the pair of interdigital electrodes 12, 13, a surface acoustic wave is propagated in a direction perpendicular to the extension direction of the finger portions 12a, 13a, that is, in a Y-axis direction.

The reflectors 14, 15 are located at opposite ends of the interdigital electrodes 12, 13 with respect to the Y-axis direction. The reflectors 14, 15 reflect the surface acoustic wave propagated from the interdigital electrodes 12, 13. Each of the reflectors 14, 15 includes multiple electrodes (i.e., reflector-electrodes) arranged in the Y-axis direction. The electrodes of the reflectors 14, 15 are parallel to each other, and parallel to the finger portions 12a, 13a.

In the present embodiment, the pair number of the interdigital electrodes 12, 13 of the first SAW resonator 2 is the same as the pair number of the interdigital electrodes 12, 13 of the second SAW resonator 4. The number of the electrodes of the reflectors 14, 15 is the same between the first SAW resonator 2 and the second SAW resonator 4. Further, an electrode width h1, h2 and an electrode pitch p1, p2 are the same between the first SAW resonator 2 and the second SAW resonator 4. Since the electrode width h1, h2 and the electrode width h1, h2 are the same between the first SAW resonator 2 and the second SAW resonator 4, the metallization ratio, that is, the ratio of the width of each electrode in the Y-axis direction and a width of a free surface, is the same therebetween.

The pair number means the number of pairs of the finger portion 12a and the finger portion 13a. That is, the pair number corresponds to the number of the finger portions 12a, 13a of each interdigital electrode 12, 13. The electrode width h1, h2 is a width of each of the finger portions 12a, 13a and the electrodes of the reflectors 14, 15. The electrode pitch p1, p2 is defined by a distance between a centerline of one electrode and a centerline of the adjacent electrode.

The first SAW resonator 2 has a first interdigitated length L1, and the second SAW resonator 4 has a second interdigitated length L2. The second interdigitated length L2 is greater than the first interdigitated length L1. The interdigitated length L1, L2 is defined by an interdigitated or overlapped dimension of the interdigital electrodes 12, 13 and the electrodes of the reflectors 14, 15.

By such a configuration, an oscillating frequency of the first oscillating circuit 3 and an oscillating frequency of the second oscillating circuit 5 are different, and the difference frequency, that is, a difference of the oscillating frequencies of the first oscillating circuit 3 and the second oscillating circuit 5 is a minute frequency. That is, in the SAW oscillator 1 of the present embodiment, the difference frequency is adjusted to a desired minute frequency.

The minute frequency is obtained in the following manner.

Figure 4A:
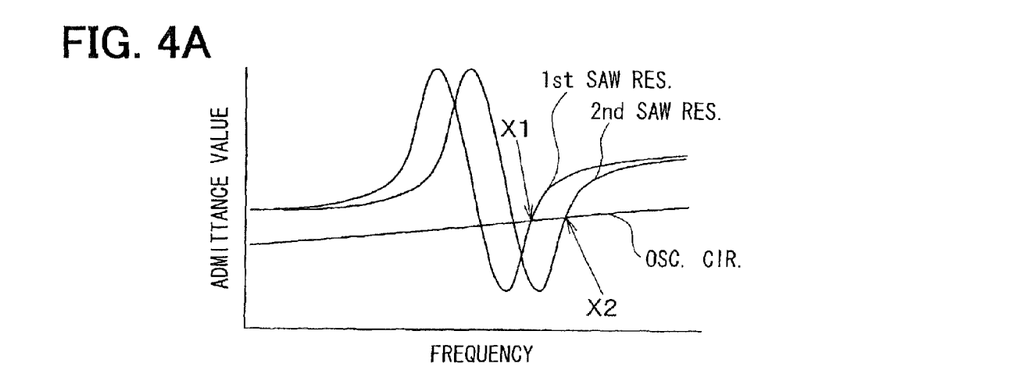
FIG. 4A is a graph showing an admittance property of two SAW elements of a SAW oscillator as a comparative example.
Figure 4B:
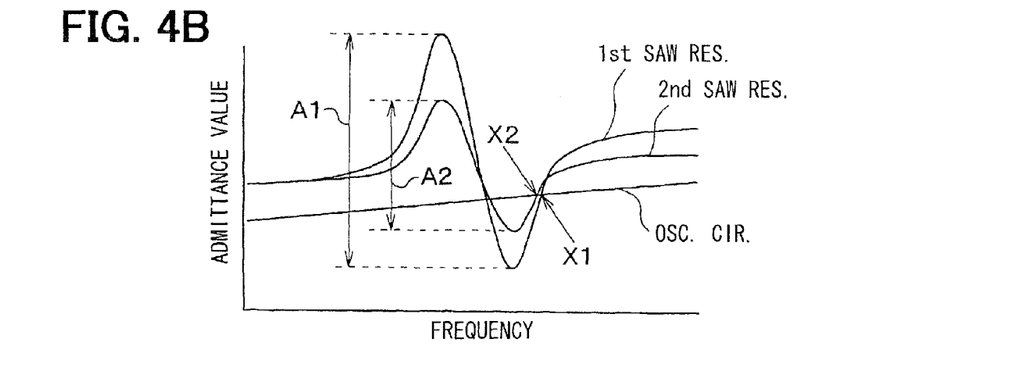
FIG. 4B is a graph showing an admittance property of the first SAW element and the second SAW element of the SAW oscillator according to the first embodiment.

FIG. 4A shows an admittance property of two SAW elements having different resonance frequencies as a comparative example. FIG. 4B shows an admittance property of two SAW elements of the present embodiment. The admittance property indicates a relation between the frequency and an admittance value. In FIGS. 4A and 4B, the horizontal axis represents the frequency, and the vertical axis represents the admittance value. The admittance property is shown by a curve having a wave-shape.

Considering an operation as the frequency-change detection type sensor, it is not always necessary to differentiate the resonance frequencies of the SAW elements. Instead, it can be configured that there is a different between the oscillating frequencies of the two SAW elements in a condition of being combined with the oscillating circuits.

As shown in FIG. 4A, the oscillating frequency, which depends on the combination of the SAW element and the oscillating circuit, is decided by intersection point X1, X2 between the admittance property of the SAW element and the admittance property of the oscillating circuit. There are two intersection points, such as high frequency-side intersection point (left in FIG. 4A) and low frequency-side intersection point (right in FIG. 4A) between the admittance property of each SAW element and the admittance property of the oscillating circuit. However, the high frequency-side intersection point X1, X2 (right in FIG. 4A) corresponds to the intersection point satisfying an oscillating condition.

In the comparative example, as shown in FIG. 4A, the first intersection point X1 and the second intersection point X2 are differentiated by employing two SAW elements, such as the first SAW resonator and the second SAW resonator, having different resonance frequencies, in order to generate the difference frequency.

In the present embodiment, as shown in FIG. 4B, the first SAW resonator 2 and the second SAW resonator 4 have different interdigitated lengths L1, L2, to differentiate the peak values of the admittance properties of the first SAW resonator 2 and the second SAW resonator 4, that is, to differentiate amplitudes A1, A2 of the curves indicating the admittance properties of the first SAW resonator 2 and the second SAW resonator 4. It is to be noted that the first oscillating circuit 3 and the second oscillating circuit 5 have the same circuit structure and thus have the same admittance property. Therefore, there is one straight line indicating the admittance property of the oscillating circuits.

Therefore, the first intersection point X1 between the admittance property of the first SAW resonator 2 and the admittance property of the first oscillating circuit 3 and the second intersection point X2 between the admittance property of the second SAW resonator 4 and the admittance property of the second oscillating circuit 5 can be differentiated slightly. The minute difference frequency smaller than that of the comparative example can be generated.

If the two SAW elements have the same admittance property, the first intersection point X1 and the second intersection point X2 coincide with each other. In the present embodiment, the first intersection point X1 and the second intersection point X2 are slightly differentiated by changing the amplitude of the curve of one of the two SAW resonators 2, 4. The peak value of the admittance is more sensitive to the change in interdigitated length than that the resonance frequency is. Therefore, the oscillating frequencies can be finely adjusted.

In setting the interdigitated length L1, L2, for example, the interdigitated lengths of the two SAW resonators 2, 4 are provisionally set. Then, the intersection points between the admittance properties of the two SAW resonators 2, 4 and the admittance properties of the oscillating circuits 3, 5 are simulated. Further, the interdigitated length of the two SAW resonators 2, 4 is gradually changed such that the difference between the first intersection point X1 and the second intersection point X2 becomes the desired difference frequency. In this way, the interdigitated length L1, L2 of the two SAW resonators 2, 4 can be adjusted.

In the present embodiment, the desired difference frequency can be adjusted by approximately every 1 kilohertz, within a range from 1 kilohertz to 500 kilohertz.

Figure 5:
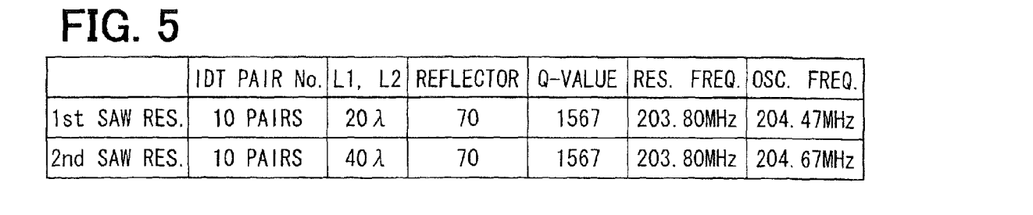
FIG. 5 is a chart showing an example of the first SAW element and the second SAW element according to the first embodiment.

FIG. 5 shows an example of the first SAW resonator 2 and the second SAW resonator 4 of the present embodiment. As shown in FIG. 5, the interdigitated length L1 of the first SAW resonator 2 is 20λ, and the interdigitated length L2 of the second SAW resonator 4 is 40λ. In this case, the first SAW resonator 2 and the second SAW resonator 4 have the same resonance frequency of 203.80 megahertz. Further, the oscillating frequency of the first SAW resonator 2 in combination with the oscillating circuit 3 is 204.47 megahertz, and the oscillating frequency of the second SAW resonator 4 in combination with the oscillating circuit 5 is 204.67 megahertz. Thus, the difference frequency is 200 kilohertz. It is to be noted that in both the first SAW resonator 2 and the second SAW resonator 4, the pair number of the interdigital electrodes 12, 13 is ten, and the number of electrodes of the reflectors 14, 15 is seventy.

In the present embodiment, the first SAW resonator 2 and the second SAW resonator 4 have the same electrode pitch p1, p2 and the same metallization ratio, and thus have the same resonance frequency. As such, the first SAW resonator 2 and the second SAW resonator 4 have the same temperature property. Furthermore, the amount of change in the resonance frequency in accordance with the change in temperature is the same between the first SAW resonator 2 and the second SAW resonator 4. Accordingly, in the present embodiment, since the amount of change in the resonance frequency due to the change in temperature can be cancelled by obtaining the difference of the resonance frequencies between the first SAW resonator 2 and the second SAW resonator 4. Therefore, it is less likely that the frequency-change detection type sensor will have a detection error.

In the present embodiment, in the second SAW resonator 4, all the finger portions 12a, 13a and electrodes of the reflectors 14, 15 have the same interdigitated length L2. Alternatively, the interdigitated length L2 can be partly changed. For example, the interdigitated length L2 of the interdigital electrodes 12, 13 of the second SAW resonator 4 is different from the interdigitated length L1 of the first SAW resonator 2, while the interdigitated length L2 of the reflectors 14, 15 of the second SAW resonator 4 is the same as the interdigitated length L1 the first SAW resonator 2. As another example, the interdigitated length L2 of a part of or some of the finger portions 12a, 13a of the second SAW resonator 4 is different from the interdigitated length L1 of the first SAW resonator 2, while the interdigitated length L2 of the other of the finger portions 12a, 13a and the reflectors 14, 15 of the second SAW resonator 4 is the same as the interdigitated length L1 of the first SAW resonator 2.

(Second Embodiment)

Figure 6:
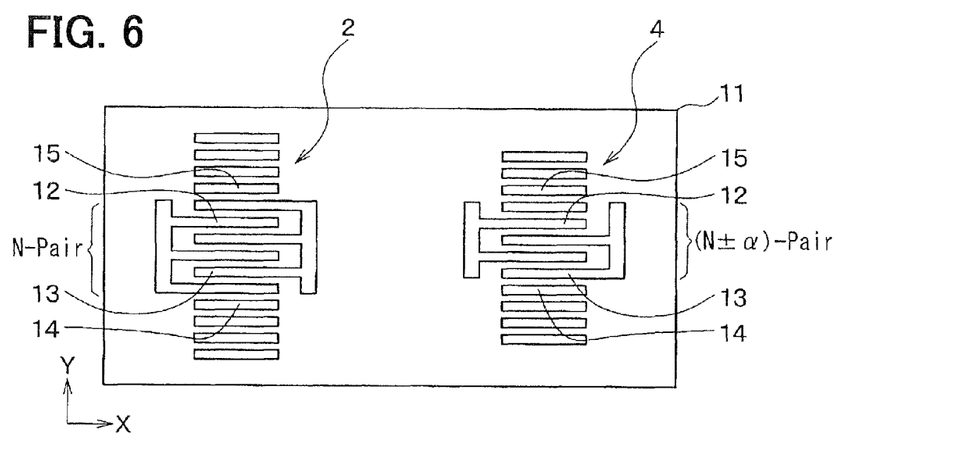
FIG. 6 is a plan view of a first SAW element and a second SAW element of a SAW oscillator according to a second embodiment of the present invention.

A second embodiment will be described with reference to FIGS. 6 and 7.

In the present embodiment, the pair number of the interdigital electrodes 12, 13 is different between the first SAW resonator 2 and the second SAW resonator 4. For example, the pair number of the interdigital electrodes 12, 13 of the first SAW resonator 2 is N, while the pair number of the interdigital electrodes 12, 13 of the second SAW resonator 4 is N±α.

The number of electrodes of the reflectors 14, 15 is the same between the first SAW resonator 2 and the second SAW resonator 4. Further, other structures, such as the electrode width h1, h2, the electrode pitch p1, p2 and the interdigitated length L1, L2 are the same between the first SAW resonator 2 and the second SAW resonator 4.

Therefore, the curves indicating the admittance property of the first SAW resonator 2 and the second SAW resonator 4 have different amplitudes. As a result, also in the present embodiment, the first intersection point X1 between the admittance property of the first SAW resonator 2 and the admittance property of the first oscillating circuit 3 and the second intersection point X2 between the admittance property of the second SAW resonator 4 and the admittance property of the second oscillating circuit 5 can be slightly differentiated. Accordingly, the minute difference frequency smaller than that generated in the comparative example can be generated.

Figure 7:
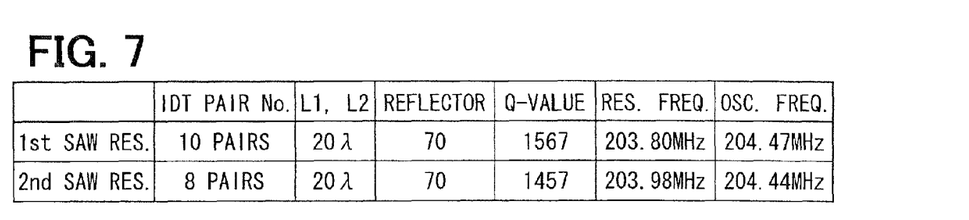
FIG. 7 is a chart showing an example of the first SAW element and the second SAW element according to the second embodiment.

FIG. 7 shows an example of the first SAW resonator 2 and the second SAW resonator 4 of the present embodiment.

As shown in FIG. 7, the pair number of the interdigital electrodes 12, 13 of the first SAW resonator 2 is ten, and the pair number of the interdigital electrodes 12, 13 of the second SAW resonator 4 is eight. In this case, the oscillating frequency of the first SAW resonator 2 in combination with the oscillating circuit 3 is 204.47 megahertz, and the oscillating frequency of the second SAW resonator 4 in combination with the oscillating circuit 5 is 204.44 megahertz. Thus, the difference frequency is 30 kilohertz. In the example, the interdigitated length L1, L2 of the first SAW resonator 2 and the second SAW resonator 4 is 20λ, The number of electrodes of the reflectors 14, 15 of each of the first SAW resonator 2 and the second SAW resonator 4 is seventy.

In addition, the first SAW resonator 2 and the second SAW resonator 4 have the same electrode pitch p1, p2, and thus have the same metallization ratio. Further, the first SAW resonator 2 and the second SAW resonator 4 have almost the same resonance frequency, and thus have substantially the same temperature property.

(Third Embodiment)

Figure 8:
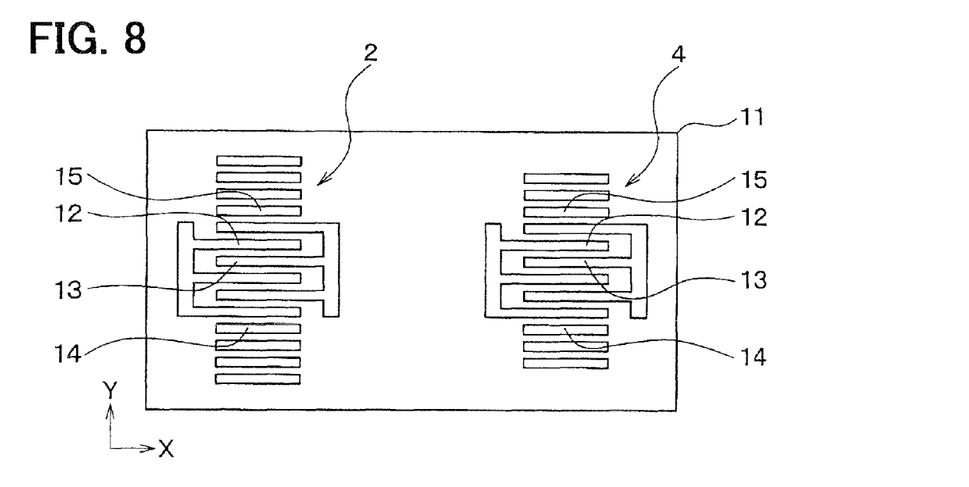
FIG. 8 is a plan view of a first SAW element and a second SAW element of a SAW oscillator according to a third embodiment of the present invention.

A third embodiment will be described with reference to FIG. 8.

In the present embodiment, the number of electrodes of the reflectors 14, 15 is different between the first SAW resonator 2 and the second SAW resonator 4. In an example of FIG. 8, the second SAW resonator 4 has the smaller number of electrodes of the reflectors 14, 15 than that of the first SAW resonator 2. Alternatively, the second SAW resonator 4 may have the larger number of electrodes of the reflectors 14, 15 than that of the first SAW resonator 2.

The pair number of the interdigital electrodes 12, 13 is the same between the first SAW resonator 2 and the second SAW resonator 4. Further, other structures, such as the electrode width h1, h2, the electrode pitch p1, p2 and the interdigitated length L1, L2 are the same between the first SAW resonator 2 and the second SAW resonator 4.

Therefore, the curves indicating the admittance property of the first SAW resonator 2 and the second SAW resonator 4 have different amplitudes. As a result, also in the present embodiment, the first intersection point X1 between the admittance property of the first SAW resonator 2 and the admittance property of the first oscillating circuit 3 and the second intersection point X2 between the admittance property of the second SAW resonator 4 and the admittance property of the second oscillating circuit 5 can be slightly differentiated. Accordingly, the minute difference frequency smaller than that generated in the comparative example can be generated.

In addition, the first SAW resonator 2 and the second SAW resonator 4 have the same electrode pitch p1, p2, and thus have the same metallization ratio. Further, the first SAW resonator 2 and the second SAW resonator 4 have almost the same resonance frequency, and thus have substantially the same temperature property.

(Fourth Embodiment)

Figure 9:
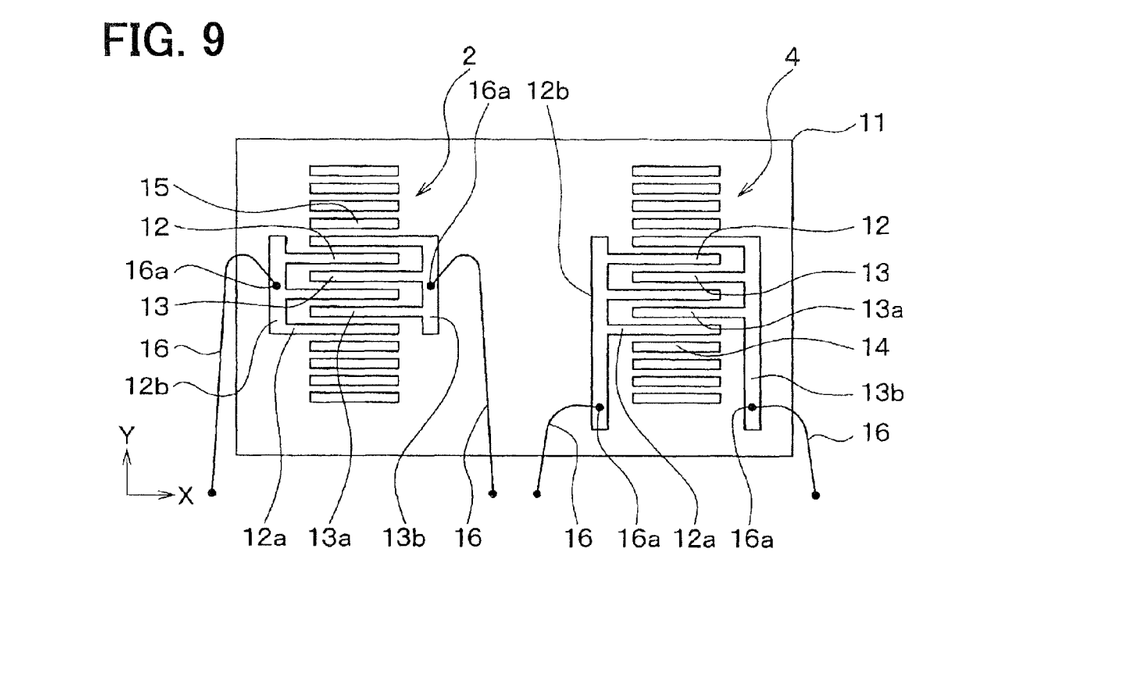
FIG. 9 is a plan view of a first SAW element and a second SAW element of a SAW oscillator according to a fourth embodiment of the present invention.

A fourth embodiment will be described with reference to FIG. 9.

In the present embodiment, the length of bus-bars 12b, 13b of the interdigital electrodes 12, 13 in the Y-axis direction is different between the first SAW resonator 2 and the second SAW resonator 4.

For example, the bus-bars 12b, 13b of the second SAW resonator 4 are longer than those of the first SAW resonator 2. Thus, pads 16a, which are connecting portions with mounted wirings 16, are further from the finger portions 12a, 13a, as compared with those of the first SAW resonator 2. Therefore, the length of the bus-bars 12b, 13b between the finger portions 12a, 13a and the pads 16a is different between the first SAW resonator 2 and the second SAW resonator 4.

Other structures, such as the pair number of the interdigital electrodes 12, 13, the number of electrodes of the reflectors 14, 15, the electrode width h1, h2, the electrode pitch p1, p2 and the interdigitated length L1, L2 are the same between the first SAW resonator 2 and the second SAW resonator 4.

In the present embodiment, because parasitic capacitance at the bus-bars 12b, 13b is different between the first SAW resonator 2 and the second SAW resonator 4, the amplitude of the curve indicating the admittance property is different between the first SAW resonator 2 and the second SAW resonator 4.

Therefore, also in the present embodiment, the first intersection point X1 between the admittance property of the first SAW resonator 2 and the admittance property of the first oscillating circuit 3 and the second intersection point X2 between the admittance property of the second SAW resonator 4 and the admittance property of the second oscillating circuit 5 can be slightly differentiated. Accordingly, the minute difference frequency smaller than that generated in the comparative example can be generated.

In addition, the first SAW resonator 2 and the second SAW resonator 4 have the same electrode pitch p1, p2, and thus have the same metallization ratio. Further, the first SAW resonator 2 and the second SAW resonator 4 have almost the same resonance frequency, and thus have substantially the same temperature property.

In the present embodiment, although the location of the pads 16a is different between the first SAW resonator 2 and the second SAW resonator 4, the location of the pads 16a can be the same between the first SAW resonator 2 and the second SAW resonator 4. This is because the parasitic capacitance is different if the length of the bus-bar 12b, 13b is different between the first SAW resonator 2 and the second SAW resonator 4.

(Fifth Embodiment)

Figure 10:
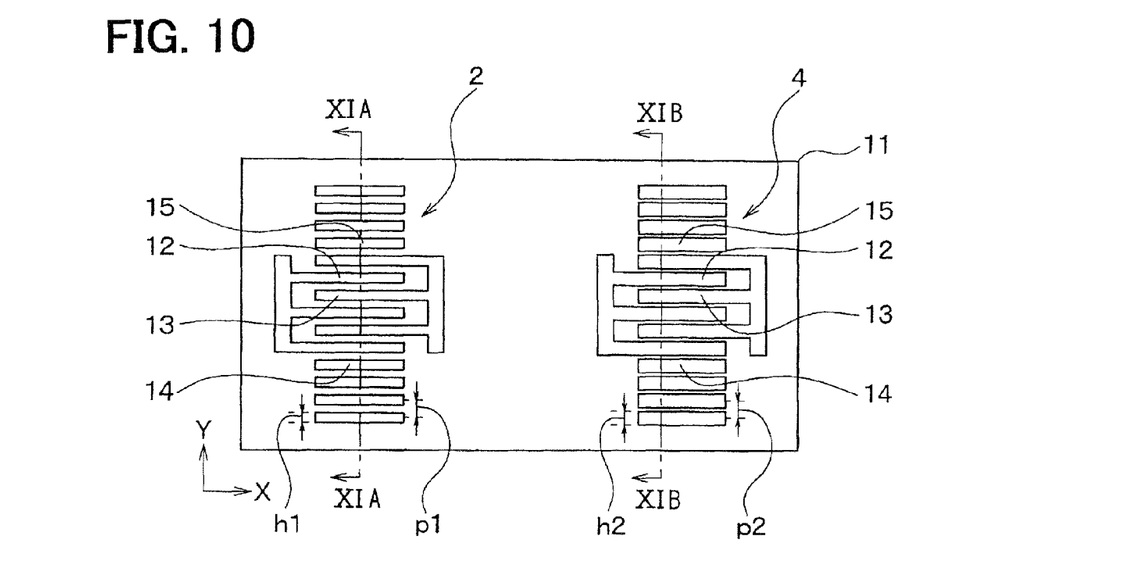
FIG. 10 is a plan view of a first SAW element and a second SAW element of a SAW oscillator according to a fifth embodiment of the present invention.
Figure 11A:
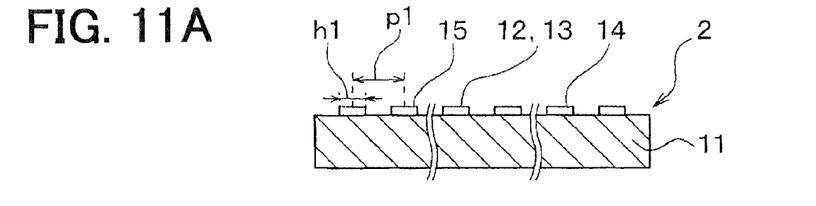
FIG. 11A is a cross-sectional view taken along a line XIA-XIA in FIG. 10.
Figure 11B:
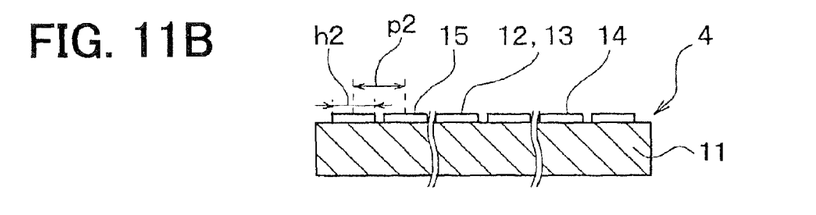
FIG. 11B is a cross-sectional view taken along a line XIB-XIB in FIG. 10.

A fifth embodiment will be described with reference to FIGS. 10, 11A and 11B.

In the present embodiment, the metallization ratio of the interdigital electrodes 12, 13 and the electrodes of the reflectors 14, 15 is different between the first SAW resonator 2 and the second SAW resonator 4.

For example, although the electrode pitch p2 of all of the interdigital electrodes 12, 13 and the electrodes of the reflectors 14, 15 of the second SAW resonator 4 is the same as the electrode pitch p1 of the first SAW resonator 2, the electrode width h2 of all of the interdigital electrodes 12, 13 and the electrodes of the reflectors 14, 15 of the second SAW resonator 4 is greater than the electrode width h1 of the first SAW resonator 2. Thus, a space between adjacent electrodes of the second SAW resonator 4, that is, the free surface is smaller than that of the first SAW resonator 2. The above magnitude relation of the metallization ratios between the first SAW resonator 2 and the second SAW resonator 4 can be reversed.

Other structures, such as the pair number of the interdigital electrodes 12, 13, the number of electrodes of the reflectors 14, 15, the electrode pitch p1, p2 and the interdigitated length L1, L2 are the same between the first SAW resonator 2 and the second SAW resonator 4.

Therefore, the curves indicating the admittance property of the first SAW resonator 2 and the second SAW resonator 4 have different amplitudes. As a result, also in the present embodiment, the first intersection point X1 between the admittance property of the first SAW resonator 2 and the admittance property of the first oscillating circuit 3 and the second intersection point X2 between the admittance property of the second SAW resonator 4 and the admittance property of the second oscillating circuit 5 can be slightly differentiated. Accordingly, the minute difference frequency smaller than that generated in the comparative example can be generated.

In the present embodiment, because the electrode pitch p1, p2 is the same between the first SAW resonator 2 and the second SAW resonator 4, the difference of the resonance frequencies is smaller than that of a case where the electrode pitch p1, p2 is different between the first SAW resonator 2 and the second SAW resonator 4. Therefore, the resonance frequencies of the first SAW resonator 2 and the second SAW resonator 4 can be substantially the same, and thus the temperature properties of the first SAW resonator 2 and the second SAW resonator 4 can be substantially the same.

In the present embodiment, the metallization ratio of all the electrodes of the second SAW resonator 4 is different from that of the first SAW resonator 2. Alternatively, the metallization ratio of a part of or some of the electrodes of the second SAW resonator 4 can be differentiated. For example, the metallization ratio of the interdigital electrodes 12, 13 may be differentiated between the first SAW resonator 2 and the second SAW resonator 4, while the metallization ratio of the reflectors 14, 15 is the same between the first SAW resonator 2 and the second SAW resonator 4. As another example, the metallization ratio of a part of or some of the finger portions 12a, 13a of the interdigital electrodes 12, 13 may be differentiated, while the other of the finger portions 12a, 13a and the reflectors 14, 15 have the same metallization ratio.

(Other Embodiments)

Figure 12:
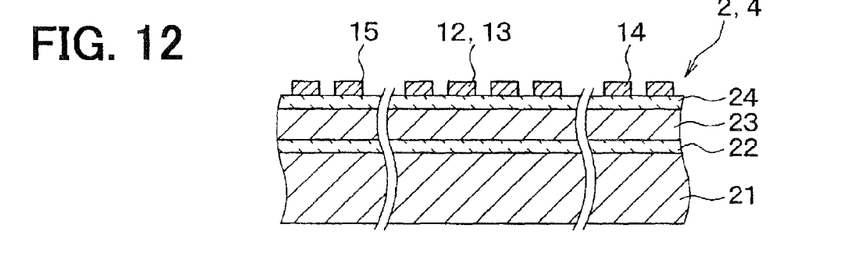
FIG. 12 is a cross-sectional view of a first SAW element and a second SAW element of a SAW oscillator according to another embodiment of the present invention.
Figure 13:
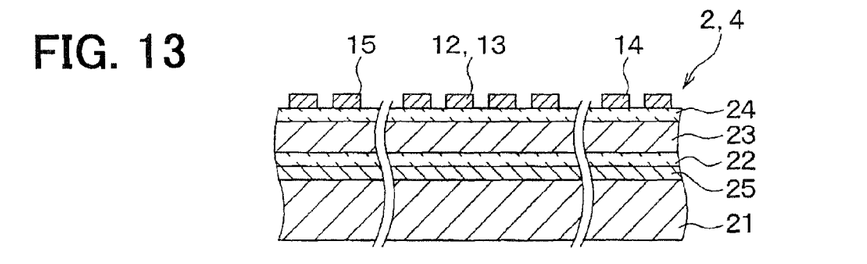
FIG. 13 is a cross-sectional view of a first SAW element and a second SAW element of a SAW oscillator according to further another embodiment of the present invention.

(1) FIGS. 12 and 13 are cross-sectional views of a first SAW resonator 2 and a second SAW resonator 4 according to other embodiments. FIGS. 12 and 13 are cross-sectional views taken along positions corresponding to the line III-III in FIG. 2. In the examples of FIGS. 12 and 13, the second SAW resonator 4 has a similar cross-section to that of the first SAW resonator 2.

In the above exemplary embodiments, the interdigital electrodes 12, 13 and the electrodes of the reflectors 14, 15 of the first SAW resonator 2 and the second SAW resonator 4 are formed on the piezoelectric substrate 11 made of the single-crystal piezoelectric material. Alternatively, the interdigital electrodes 12, 13 and the electrodes of the reflectors 14, 15 of the first SAW resonator 2 and the second SAW resonator 4 can be formed on a thin piezoelectric film 23, in place of the piezoelectric substrate 11. The thin piezoelectric film 23 is made of a piezoelectric material.

In the example of FIG. 12, a lower oxidize film 22, the thin piezoelectric film 23, an upper oxidize film 24 are laminated on a substrate 21 in this order. The interdigital electrodes 12, 13 and the electrodes of the reflectors 14, 15 are formed on the upper oxidize film 24.

In the example of FIG. 13, a lower electrode 25 is added between the substrate 21 and the lower oxidize film 22 in the structure of FIG. 12.

(2) In the above exemplary embodiments, the first oscillating circuit 3 including the first SAW resonator 2 and the second oscillating circuit 5 including the second SAW resonator 4 are configurated as separate oscillating circuits. Alternatively, the first oscillating circuit 3 and the second oscillating circuit 5 can be configured into a single oscillating circuit. In such a case, the single oscillating circuit includes a first oscillating circuit part that forms an oscillating loop having the first SAW resonator 2 as a component and a second oscillating circuit part that forms an oscillating loop having the second SAW resonator 4.

(3) The above exemplary embodiments may be suitably combined in various ways. For example, the first embodiment and the second embodiment may be combined. In such a case, the interdigitated length L1, L2 and the pair number of the interdigital electrodes 12, 13 are differentiated between the first SAW resonator 2 and the second SAW resonator 4. As another example, the third embodiment may be combined with the combination of the first and second embodiments. In such a case, the interdigitated length L1, L2, the pair number of the interdigital electrodes 12, 13, and the number of electrodes of the reflectors 14, 15 are differentiated between the first SAW resonator 2 and the second SAW resonator 4. As further another example, the fourth embodiment may be combined with the combination of the first through third embodiments. In such a case, the interdigitated length L1, L2, the pair number of the interdigital electrodes 12, 13, the number of electrodes of the reflectors 14, 15 and the length of the busbars 12b, 13b are differentiated between the first SAW resonator 2 and the second SAW resonator 4.

(4) In the above exemplary embodiments, the SAW resonator 1 is exemplarily employed as the frequency-change detection type sensor. The SAW resonator 1 of the above exemplary embodiments can be employed for any other purposes.

Additional advantages and modifications will readily occur to those skilled in the art. The invention in its broader term is therefore not limited to the specific details, representative apparatus, and illustrative examples shown and described.

What is claimed is:

1. A surface acoustic wave oscillator comprising:
a first surface acoustic wave element and a second surface acoustic wave element each including interdigital electrodes and a reflector formed on a piezoelectric material, the interdigital electrodes having a plurality of finger portions, the reflector having a plurality of reflector-electrodes;
a first oscillating circuit part forming an oscillating loop including the first acoustic wave element as a component; and
a second oscillating circuit part forming an oscillating loop including the second acoustic wave element as a component, wherein
the first oscillating circuit part and the second oscillating circuit part are configured to have an identical admittance property,
the first surface acoustic wave element and the second surface acoustic wave element are configured that an electrode pitch of the finger portions and reflector-electrodes is identical between the first surface acoustic wave element and the second surface acoustic wave element, and an amplitude of a curve of an admittance property indicating a relation between a frequency and an admittance value is different between the first surface acoustic wave element and the second surface acoustic wave element, wherein
a first intersection point between the admittance property of the first surface acoustic wave element and the admittance property of the first oscillating circuit part and a second intersection point between the admittance property of the second surface acoustic wave element and the admittance property of the second oscillating circuit part are at different frequencies, and
an interdigitated length of at least a part of the finger portions and reflector-electrodes is different between the first surface acoustic wave element and the second surface acoustic wave element.

2. A surface acoustic wave oscillator comprising:
a first surface acoustic wave element and a second surface acoustic wave element each including interdigital electrodes and a reflector formed on a piezoelectric material, the interdigital electrodes having a plurality of finger portions, the reflector having a plurality of reflector-electrodes;
a first oscillating circuit part forming an oscillating loop including the first acoustic wave element as a component; and
a second oscillating circuit part forming an oscillating loop including the second acoustic wave element as a component, wherein
the first oscillating circuit part and the second oscillating circuit part are configured to have an identical admittance property,
the first surface acoustic wave element and the second surface acoustic wave element are configured that an electrode pitch of the finger portions and reflector-electrodes is identical between the first surface acoustic wave element and the second surface acoustic wave element, and an amplitude of a curve of an admittance property indicating a relation between a frequency and an admittance value is different between the first surface acoustic wave element and the second surface acoustic wave element, wherein a first intersection point between the admittance property of the first surface acoustic wave element and the admittance property of the first oscillating circuit part and a second intersection point between the admittance property of the second surface acoustic wave element and the admittance property of the second oscillating circuit part are at different frequencies, the interdigital electrodes is a first interdigital electrode and a second interdigital electrode, the finger portions of the first interdigital electrode are paired with the finger portions of the second interdigital electrode, and a number of paired finger portions is different between the first surface acoustic wave element and the second surface acoustic wave element.

3. A surface acoustic wave oscillator comprising:

a first surface acoustic wave element and a second surface acoustic wave element each including interdigital electrodes and a reflector formed on a piezoelectric material, the interdigital electrodes having a plurality of finger portions, the reflector having a plurality of reflector-electrodes;

a first oscillating circuit part forming an oscillating loop including the first acoustic wave element as a component; and a second oscillating circuit part forming an oscillating loop including the second acoustic wave element as a component, wherein the first oscillating circuit part and the second oscillating circuit part are configured to have an identical admittance property, the first surface acoustic wave element and the second surface acoustic wave element are configured that an electrode pitch of the finger portions and reflector-electrodes is identical between the first surface acoustic wave element and the second surface acoustic wave element, and an amplitude of a curve of an admittance property indicating a relation between a frequency and an admittance value is different between the first surface acoustic wave element and the second surface acoustic wave element, wherein a first intersection point between the admittance property of the first surface acoustic wave element and the admittance property of the first oscillating circuit part and a second intersection point between the admittance property of the second surface acoustic wave element and the admittance property of the second oscillating circuit part are at different frequencies, and a number of the reflector-electrodes is different between the first surface acoustic wave element and the second surface acoustic wave element.

4. A surface acoustic wave oscillator comprising:

a first surface acoustic wave element and a second surface acoustic wave element each including interdigital electrodes and a reflector formed on a piezoelectric material, the interdigital electrodes having a plurality of finger portions, the reflector having a plurality of reflector-electrodes;

a first oscillating circuit part forming an oscillating loop including the first acoustic wave element as a component; and a second oscillating circuit part forming an oscillating loop including the second acoustic wave element as a component, wherein the first oscillating circuit part and the second oscillating circuit part are configured to have an identical admittance property, the first surface acoustic wave element and the second surface acoustic wave element are configured that an electrode pitch of the finger portions and reflector-electrodes is identical between the first surface acoustic wave element and the second surface acoustic wave element, and an amplitude of a curve of an admittance property indicating a relation between a frequency and an admittance value is different between the first surface acoustic wave element and the second surface acoustic wave element, wherein a first intersection point between the admittance property of the first surface acoustic wave element and the admittance property of the first oscillating circuit part and a second intersection point between the admittance property of the second surface acoustic wave element and the admittance property of the second oscillating circuit part are at different frequencies, each of the interdigital electrodes has a bus-bar connecting the plurality of finger portions, and a length of the bus-bar is different between the first surface acoustic wave element and the second surface acoustic wave element.

5. A surface acoustic wave oscillator comprising:

a first surface acoustic wave element and a second surface acoustic wave element each including interdigital electrodes and a reflector formed on a piezoelectric material, the interdigital electrodes having a plurality of finger portions, the reflector having a plurality of reflector-electrodes;

a first oscillating circuit part forming an oscillating loop including the first acoustic wave element as a component; and a second oscillating circuit part forming an oscillating loop including the second acoustic wave element as a component, wherein the first oscillating circuit part and the second oscillating circuit part are configured to have an identical admittance property, the first surface acoustic wave element and the second surface acoustic wave element are configured that an electrode pitch of the finger portions and reflector-electrodes is identical between the first surface acoustic wave element and the second surface acoustic wave element, and an amplitude of a curve of an admittance property indicating a relation between a frequency and an admittance value is different between the first surface acoustic wave element and the second surface acoustic wave element, wherein a first intersection point between the admittance property of the first surface acoustic wave element and the admittance property of the first oscillating circuit part and a second intersection point between the admittance property of the second surface acoustic wave element and the admittance property of the second oscillating circuit part are at different frequencies, and a metallization ratio of at least a part of the finger portions and reflector-electrodes is different between the first surface acoustic wave element and the second surface acoustic wave element.

* * * * *